(12) United States Patent
Lee et al.

(10) Patent No.: US 6,462,577 B1
(45) Date of Patent: Oct. 8, 2002

(54) CONFIGURABLE MEMORY STRUCTURES IN A PROGRAMMABLE LOGIC DEVICE

(75) Inventors: Andy L. Lee, San Jose, CA (US); Christopher F. Lane, San Jose, CA (US); Srinivas T. Reddy, Fremont, CA (US); Brian D. Johnson, Sunnyvale, CA (US); Ketan H. Zaveri, San Jose, CA (US); Mario Guzman, San Jose, CA (US); Quyen Doan, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/761,608

(22) Filed: Jan. 16, 2001

Related U.S. Application Data
(60) Provisional application No. 60/200,642, filed on Apr. 28, 2000.

(51) Int. Cl.[7] .................... H03K 19/177; H03K 19/173
(52) U.S. Cl. ........................................... 326/40; 326/47
(58) Field of Search .......................... 326/41, 47, 37–40

(56) References Cited

U.S. PATENT DOCUMENTS

| | | | |
|---|---|---|---|
| 5,212,652 A | 5/1993 | Agrawal et al. | |
| 5,343,406 A | 8/1994 | Freeman et al. | |
| 5,352,940 A | 10/1994 | Watson | |
| 5,414,377 A | 5/1995 | Freidin | 326/41 |
| 5,426,378 A | * 6/1995 | Ong | 326/39 |
| 5,432,719 A | 7/1995 | Freeman et al. | |
| 5,488,316 A | 1/1996 | Freeman et al. | 326/41 |
| 5,550,782 A | 8/1996 | Cliff et al. | 365/230.03 |
| 5,566,123 A | 10/1996 | Freidin et al. | 365/230.05 |
| 5,572,148 A | 11/1996 | Lytle et al. | 326/41 |
| 5,631,577 A | 5/1997 | Freidin et al. | 326/40 |
| 5,648,732 A | 7/1997 | Duncan | 326/40 |
| 5,689,195 A | 11/1997 | Cliff et al. | 326/41 |
| 5,758,192 A | 5/1998 | Alfke | |
| 5,809,281 A | * 9/1998 | Steele et al. | 711/170 |
| 5,889,413 A | 3/1999 | Bauer | 326/40 |
| 5,898,893 A | 4/1999 | Alfke | 395/877 |
| 5,926,036 A | 7/1999 | Cliff et al. | 326/40 |
| 6,049,223 A | 4/2000 | Lytle et al. | 326/40 |
| 6,049,487 A | * 4/2000 | Plants et al. | 365/189.04 |
| 6,150,839 A | * 11/2000 | New et al. | 326/40 |

OTHER PUBLICATIONS

U.S. patent application Ser. No. 09/007,718, Zaveri et al., filed Jan. 15, 1998.
U.S. patent application Ser. No. 09/266,235, Jefferson et al., filed Mar. 10, 1999.

(List continued on next page.)

*Primary Examiner*—Michael Tokar
*Assistant Examiner*—James H. Cho
(74) *Attorney, Agent, or Firm*—Fish & Neave; Robert R. Jackson; Joo-Youn Park

(57) ABSTRACT

A programmable logic device is provided in which logic array blocks (LABs) may be programmably configured for use as one of a variety of memory structures. The configurable memory structures may have separate read and write addresses, thereby making it possible to implement a variety of memory structures such as FIFO memory, ROM, RAM, and shift-registers.

30 Claims, 12 Drawing Sheets

OTHER PUBLICATIONS

P. Chow et al., "A 1.2μm CMOS FPGA using Cascaded Logic Blocks and Segmented Routing", *FPGAs*, Chapter 3.2, pp. 91–102, W.R. Moore and W. Luk (eds.), Abingdon EE&CS Books, Abingdon (UK), 1991.

L. Mintzer, "FIR Filters with the Xilinx FPGA", FPGA '92 #129–#134.

"Optimized Reconfigurable Cell Array (ORCA) Series Field–Programmable Gate Arrays", Advance Data Sheet, AT&T Microelectronics, Feb. 1993, pp. 1–36 and 65–87.

*The Programmable Logic Data Book*, 1994, Xilinx, Inc., San Jose, CA, cover pages and pp. 2–5 through 2–102 ("XC4000 Logic Cell Array Families").

B. Klein, "Use LFSRs to Build Fast FPGA–Based Counters", Electronic Design, Mar. 21, 1994, pp. 87, 88, 90, 94, 96, 97, and 100.

A. DeHon, "Reconfigurable Architectures for General–Purpose Computing", M.I.T. Ph.D. thesis, Sep. 1996.

R. Iwanczuk, "Using the XC4000 RAM Capability", XAPP 031.000, Xilinx, Inc., San Jose, CA.

J.R. Hauser et al., "Garp: A MIPS Processor with a Reconfigurable Coprocessor", 0–8186–8159–4/97 $10.00© 1997 IEEE, pp. 12–21.

A. Ohta et al., "New FPGA Architecture for Bit–Serial Pipeline Datapath", 0–8186–8900–5/98 $10.00© 1998 IEEE, pp. 58–67.

"XC4000E and XC4000X Series Field Programmable Gate Arrays: Product Specification", May 14, 1999 (Version 1.6), Xilinx, Inc., San Jose, CA, pp. 6–5 through 6–72.

"Flex 10K Embedded Programmable Logic Family", Data Sheet, Jun. 1999, ver. 4.01, Altera Corporation, San Jose, CA, pp. 1–137.

"Flex 10KE Embedded Programmable Logic Family", Data Sheet, Aug. 1999, ver. 2.02, Altera Corporation, San Jose, CA, pp. 1–120.

"XC4000XLA/XV Field Programmable Gate Arrays: Product Specification", DS015 (v1.3) Oct. 18, 1999, Xilinx, Inc., San Jose, CA, pp. 6–157 through 6–170.

"Triscend E5 Configurable System–on–Chip Family", Triscend Corporation, Jan. 2000 (Version 1.00) Product Description, cover page and pp. 25–28.

"Apex 20K Programmable Logic Device Family", Data Sheet, Mar. 2000, ver. 2.06, Altera Corporation, San Jose, CA, pp. 1–208.

"Virtex 2.5V Field Programmable Gate Arrays", DS003 (v.2.0), Preliminary Product Specification, Mar. 9, 2000, Xilinx, Inc., San Jose, CA, pp. 1–72.

"Virtex–E 1.8V Extended Memory Field Programmable Gate Arrays", DS025 (v1.0) Mar. 23, 2000, Advance Product Specification, Xilinx, Inc., San Jose, CA, pp. 1 and 6.

* cited by examiner

CONFIGURABLE MEMORY STRUCTURES IN A PROGRAMMABLE LOGIC DEVICE

CROSS REFERENCE TO RELATED APPLICATION

This claims the benefit of U.S. Provisional Patent Application No. 60/200,642, filed Apr. 28, 2000.

BACKGROUND OF THE INVENTION

This invention relates to programmable logic devices, and more particularly to implementing configurable memory structures within such devices.

Common architectural features of programmable logic devices include a two-dimensional array of rows and columns of logic array blocks (LABs) and a programmable network of interconnection conductors for conveying signals between the LABs. The design of programmable logic devices may be enhanced by the addition of large memory blocks (e.g., random access memory (RAM) or read-only memory (ROM)) between the LABs (see, for example, Cliff et al. U.S. Pat. No. 5,689,195, and Jefferson et al. U.S. Pat. No. 6,215,326).

Such memory blocks are useful for storing large blocks of data and/or performing various logic functions that may be more efficiently performed in a single large memory block rather than in several LABs. However, there are some applications in which using these memory blocks may not be an efficient use of system resources. When applications use only a fraction of the available capacity of these memory blocks, for example, the chip area and the interconnect resources allocated to these memory blocks are not being used efficiently.

SUMMARY OF THE INVENTION

The present invention relates to an improved LAB that allows a user to programmably selectively implement a variety of different memory structures on a programmable logic device. The improved LAB is programmably configurable for operation in at least two modes: in a first mode, the LAB may be configured to perform logic functions; in a second mode, the LAB may be configured to implement various memory schemes (e.g., shift-registers, first-in-first-out (FIFO) memory, RAM/ROM, etc.).

The improved LAB that may be constructed in accordance with the principles of the present invention possesses several advantageous features over conventional LAB designs. For example, the improved LAB will allow a user to efficiently build modular memory structures in a programmable logic device by allowing the user to programmably configure, as necessary, specific LABs for implementing any of a variety of different memory schemes.

Further features of the invention, its nature and various advantages will be more apparent from the accompanying drawings and the following detailed description of the invention.

BRIEF DESCRIPTION OF THE DRAWINGS

FIG. 1b is a simplified block diagram of an alternative embodiment of the device of FIG. 1a.

FIG. 3b is a simplified block diagram of an alternative embodiment of the circuit of FIG. 3a.

DETAILED DESCRIPTION OF THE INVENTION

Figure 1A:
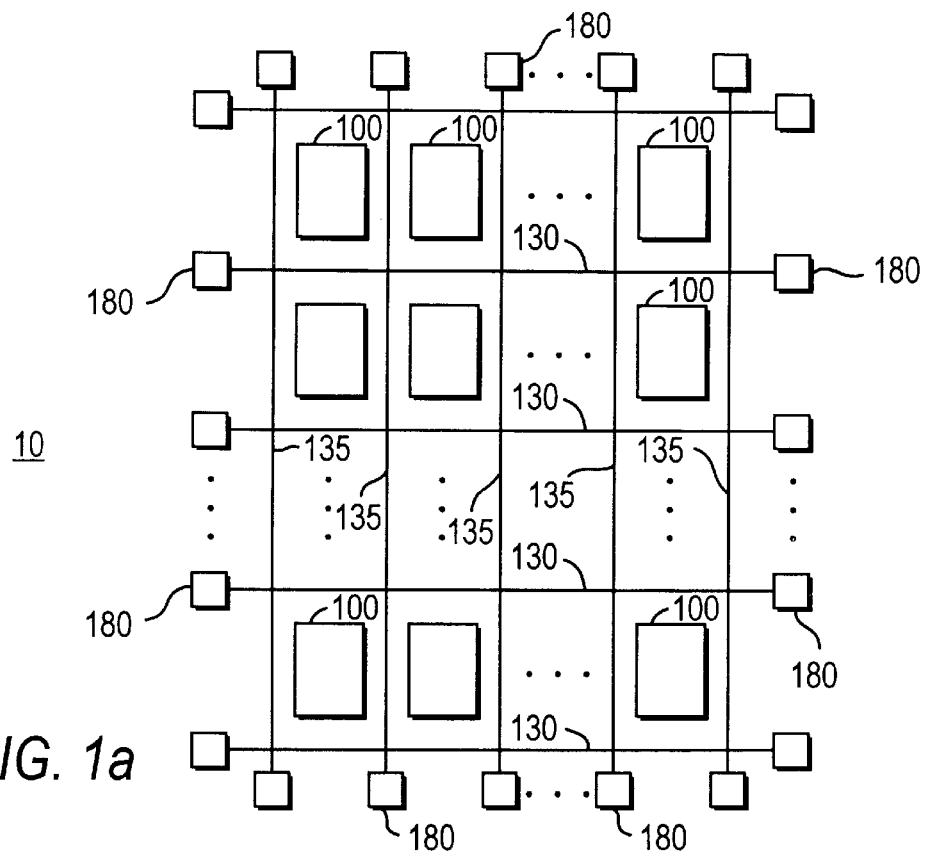
FIG. 1a is a simplified block diagram of an illustrative programmable logic device.

FIG. 1a is a simplified block diagram of an illustrative programmable logic device 10 which may be improved in accordance with the principles of the present invention. Device 10 includes a plurality of LABs 100, operatively disposed in a two-dimensional array of rows and columns, and a programmable network of horizontal 130 and vertical 135 interconnection conductors for conveying signals amongst the LABs 100 and various I/O structures 180.

Figure 1B:
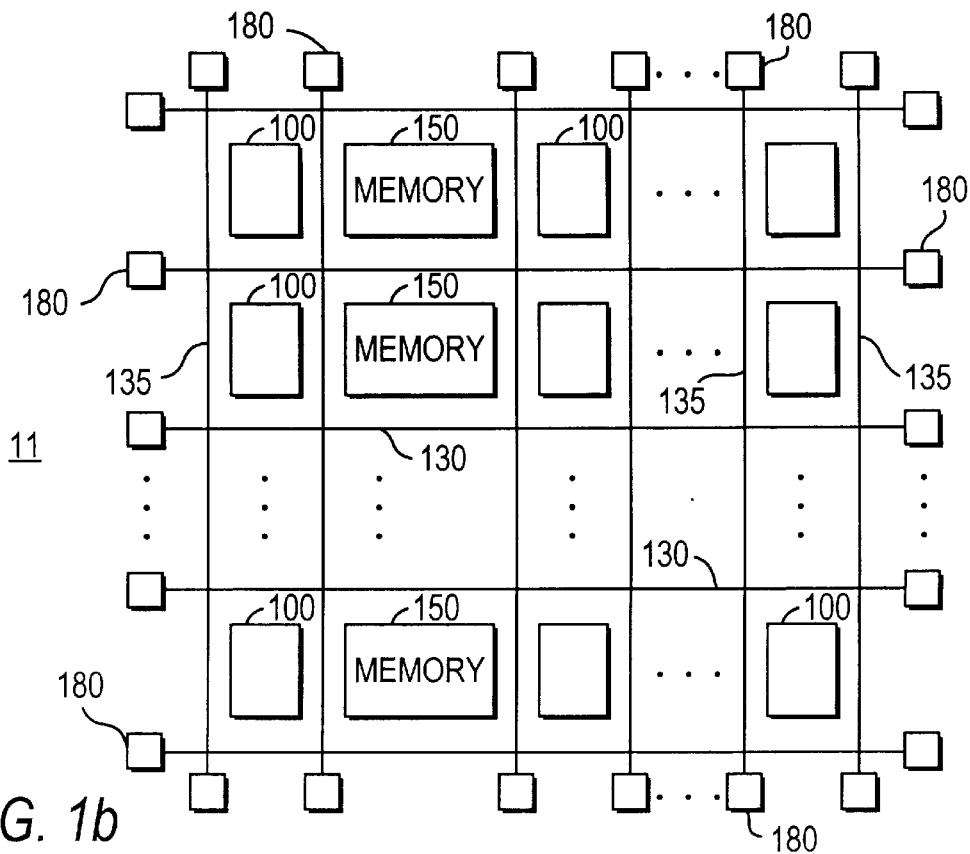

For applications in which the availability of a user-programmable block of programmable memory may be a useful feature, an alternative embodiment of device 10 is shown in FIG. 1b. FIG. 1b shows a programmable logic device 11 in which blocks of memory 150 are embedded in the two-dimensional array of LABs 100. Memory blocks 150 may be used to store data for use in performing logic functions that may be more efficiently performed in a single, relatively large memory structure rather than in several LABs 100. In addition, memory blocks 150 may be configurable for a variety of uses, such as ROM, RAM, or FIFO memory.

Because memory blocks 150 are often designed to accommodate relatively large blocks of data, there are some applications in which using memory blocks 150 may not always be an efficient use of system resources: when applications require only a fraction of the available capacity of these memory blocks 150, for example, the chip area and the interconnect resources allocated to the memory blocks 150 are not being used efficiently.

The present invention seeks to improve the design of programmable logic devices by providing an improved LAB in which a variety of memory structures may be programmably selectively implemented as the need arises. In accordance with the principles of the present invention, the improved LAB will allow a user to efficiently build modular memory structures in a programmable logic device by allowing the user to programmably configure, as necessary, specific LABs for implementing any of a variety of different memory schemes.

Figure 2:
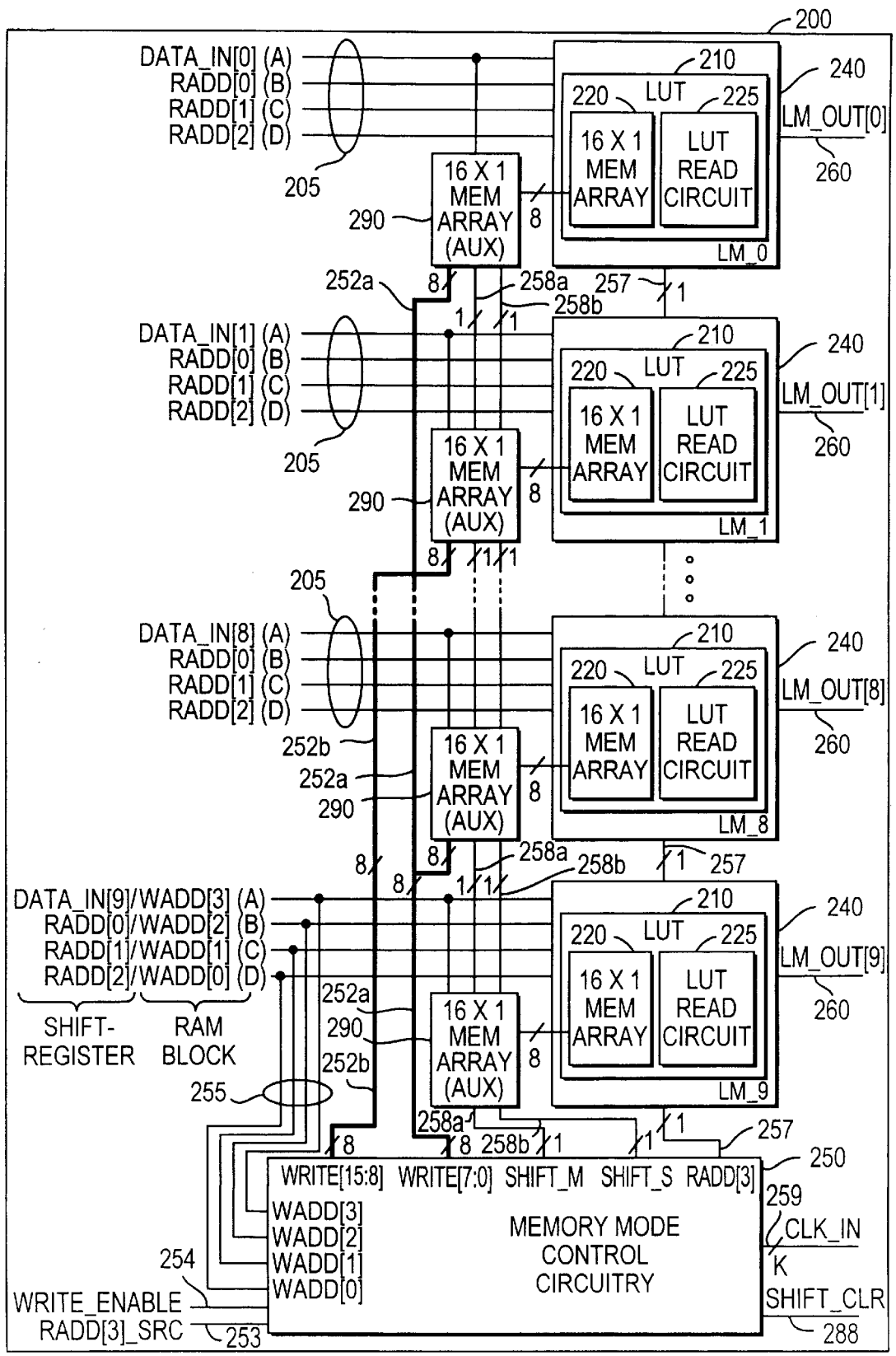
FIG. 2 is a simplified block diagram of a logic array block that may be constructed in accordance with the principles of the present invention.

FIG. 2 illustrates one embodiment of an improved LAB 200 that may be constructed in accordance with the principles of the present invention. LAB 200 includes a plurality of logic modules 240. For the purpose of illustration, there are ten logic modules 240 shown in FIG. 2; however, any number of logic modules 240 may be used. Each logic module 240 has a Look-Up-Table (LUT) 210 that includes an associated LUT configuration memory 220, which, for the purpose of illustration, is shown as a 16×1 memory array for storing the configuration data for 16-bit LUT 210. For accessing any one of the sixteen memory locations within its associated LUT configuration memory 220, each logic module 240 includes a LUT read circuit 225 that is addressable via four LUT input leads 205.

In accordance with the principles of the present invention, LAB 200 is usable in at least two modes: logic mode and memory mode. In logic mode, logic modules 240 may be used to perform LUT-based logic functions. In memory mode, LAB 200 may be configured to implement various memory schemes. In order to efficiently configure LAB 200 as any one of a variety of memory structures during memory mode, LAB 200 may include a plurality of auxiliary memory elements 290, each of which may be associated with a respective one of the logic modules 240 and may be programmably configurable for implementing different memory schemes. In one embodiment, the auxiliary memory elements 290 may be addressed with separate read and write addresses during memory mode. The types of memory structures that may be implemented with auxiliary memory elements 290 within LAB 200 include shift-registers, FIFOs, LIFOs, and RAMs/ROMs of varying depths and widths. For the purpose of illustration, however, the configuration of auxiliary memory elements 290 as shift-registers and as RAM blocks will be discussed in detail herein.

FIG. 2 provides an overview of the structures within LAB 200 that may be used during memory mode when implementing shift-registers and RAM blocks using auxiliary memory elements 290. When LAB 200 is configured for use as a set of shift-registers during memory mode, the LUT input leads 205 of the logic modules 240 may be used for providing data and read addresses for the auxiliary memory elements 290. For the purpose of illustration, as shown in FIG. 2, one of the LUT input leads 205 (e.g., the (A) input) of each logic module 240 is used as the data input lead for its associated auxiliary memory element 290. Similarly, the remaining LUT input leads 205 (e.g., the (B), (C), and (D) inputs) of each logic module 240 may be used to provide a 3-bit read address, RADD[2:0], for reading its associated auxiliary memory element 290 by using the LUT read circuit 225 within its associated LUT 210. (The use of LUT read circuit 225 will be discussed later in further detail.) The 3-bit read address, RADD[2:0], for each auxiliary memory element 290 may be a set of LAB-wide signals that are applied to all the logic modules 240 such that the same bit location is addressed in each auxiliary memory element 290. Alternatively, each logic module 240 may be supplied a different 3-bit read address for greater flexibility in addressing specific combinations of bit locations.

Because three of the four LUT input leads of each logic module 240 are used during memory mode as address leads to access the auxiliary memory element 290 associated with that logic module 240, the shift-register that is implemented within a single auxiliary memory element 290 would have a maximum effective depth of eight bits. Accordingly, auxiliary memory element 290 is shown in FIG. 2 as a 16×1 memory array, in which two memory cells within the array may be combined to form a master/slave pair, thereby providing up to eight shift-register bits.

In addition to an 8-bit shift-register, a 16-bit shift-register may be readily implemented within LAB 200 by cascading adjacent 8-bit shift-registers. When 16-bit shift-registers are implemented, a fourth read address bit, RADD[3], which may be provided by memory mode control circuitry 250 (to be described later), may be additionally used. Deeper shift-registers may be implemented by cascading multiple shift-registers and by providing additional read address bits using memory mode control circuitry 250. In addition, within a single auxiliary memory element 290, a shift-register of any length between 1-bit and 8-bits may be implemented based on the RADD signals supplied to the LUT read circuit 225 of the logic module 240 associated with that auxiliary memory element 290. In those embodiments of logic module 240 that include output registering circuitry, a 9-bit shift-register may also be implemented by registering the output of the LUT read circuit 225. In accordance with the principles of the present invention, different combinations of shift-registers of various lengths may thus be implemented within a single LAB 200 by configuring the length of each shift-register implemented by a given auxiliary memory element 290 and its associated logic module 240 and, depending on the application, cascading the shift-registers thus implemented. For example, LAB 200 may be configured as ten shift-registers, each having a length anywhere from one to nine bits; or five 16-bit shift-registers; or two 17-bit shift-registers and six 5-bit shift-registers; or one 90-bit shift-register, etc.

In accordance with the principles of the present invention, the shift-registers implemented within LAB 200 may be further configured for use as FIFO memories. The FIFO memories thus implemented may be suitable for operation in either synchronous or asynchronous modes. In one possible implementation of a FIFO, a counter may be used to generate the read address (e.g., RADD[2:0] for 8-bit operation; RADD[3:0] for 16-bit operation) that is used for reading out the leading data in the shift-register. One illustrative arrangement for operating a FIFO thus implemented in LAB 200 is as follows: whenever data is written into the FIFO by shifting a bit into the shift-register, the read address of the shift-register is incremented; when data is read from the FIFO, the read address is decremented. In a similar fashion, last-in-first-out (LIFO) memories may also be implemented.

When LAB 200 is configured for use as a set of RAM blocks during memory mode, the LUT input leads 205 of each logic module 240 may be used in a fashion similar to the shift-register implementation for supplying data and address signals for auxiliary memory elements 290: the (A) input may be used to provide data, and the (B), (C), and (D) inputs may be used to provide a 3-bit read address, RADD [2:0], for each auxiliary memory element 290 that is configured for use as a RAM block. As in the shift-register implementation, the 3-bit read address, RADD[2;0], may be a set of LAB-wide signals that are applied to all the logic modules 240 such that the same bit location is addressed in each auxiliary memory element 290. Alternatively, each logic module 240 may be supplied a different 3-bit read address, RADD[2:0], to allow greater flexibility in addressing specific combinations of bit locations. Using a 3-bit read address provides each RAM block with a maximum effective depth of eight bits. Accordingly, when the 16×1 auxiliary memory element 290 is configured for use as a RAM-block, half of the sixteen memory cells therein will be addressable for use as RAM cells. (An illustrative arrangement for mapping eight effective bit locations into sixteen memory cells will be described later.)

The RAM blocks implemented by auxiliary memory elements 290 may be addressed for writing by a set of write address signals that are supplied to the inputs of a respective one of the logic modules 240 in LAB 200. As shown in FIG. 2, the LUT input leads 205 of the logic module 240 designated LM_9 are used for supplying a 4-bit write address, WADD[3:0], to memory mode control circuitry 250 (via leads 255). In the embodiment shown in FIG. 2, all four LUT input leads 205 of LM_9 are being used for WADD[3:0]; accordingly, the auxiliary memory element 290 associated with LM_9 may not be used to implement a RAM block when LAB 200 is configured as a set of RAM blocks during memory mode.

For the purposes of the present invention, memory mode control circuitry 250 may be configured to decode WADD[3:0] into two sets of 8-bit WRITE signals, WRITE[7:0] and WRITE[15:8], which may be applied on leads 252a and 252b, respectively. Generating two sets of 8-bit WRITE signals allows data to be efficiently written to auxiliary memory elements 290 when LAB 200 is operated either as a set of 8-bit RAM blocks or as a set of 16-bit RAM blocks (the details of 8-bit/16-bit operation will be discussed later). These WRITE signals are applied LAB-wide such that the same bit location is addressed within each 8-bit RAM block (or, alternatively, each 16-bit RAM block) implemented within LAB 200.

Memory mode control circuitry 250 may be responsive to a WRITE_ENABLE signal supplied on lead 254. The WRITE_ENABLE signal may be provided to memory mode control circuitry 250 by using an input to LAB 200 that would have been used for generating miscellaneous LAB-wide signals such as clocks and clears. In addition to the WRITE_ENABLE signal, other inputs to the memory mode control circuitry 250 may include: a RADD[3]_SRC signal, applied on lead 253, from which the fourth read address bit, RADD[3], may be generated; a SHIFT_CLR signal, applied on lead 288, which may be used to control the clearing of the shift-registers implemented during memory mode; and K different clock signals, represented as CLK_IN on leads 259, which may be used for generating the various clocks that may be used by LAB 200 during memory mode.

Figure 3A:
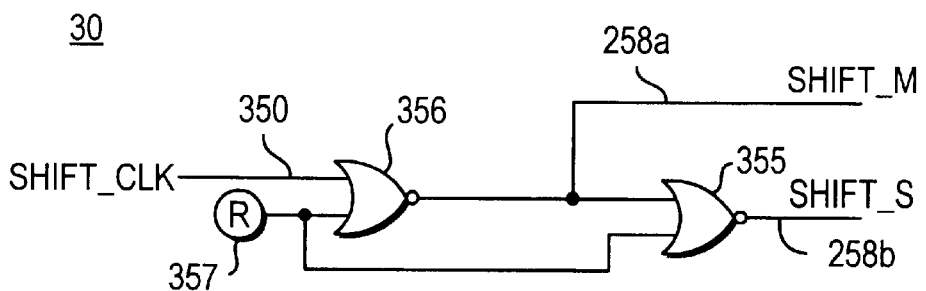
FIG. 3a is a simplified block diagram of a circuit which may be used in the logic array block of FIG. 2.

For use in clocking the shift-registers implemented during memory mode, memory mode control circuitry 250 may generate a pair of clocks, SHIFT_M and SHIFT_S, from a single clock signal, SHIFT_CLK, using the circuit 30 shown in FIG. 3a. In one embodiment, SHIFT_CLK may be one of the K different clocks supplied to memory mode control circuitry 250. Circuit 30 may be controlled by a function control element (FCE) 357, represented as "®", which may be set when programming the device that includes LAB 200. The logic value associated with FCE 357 may determine whether or not circuit 30 generates a two-phase clock from SHIFT_CLK. For example, if FCE 357 were programmed logic LOW, the resulting SHIFT_M and SHIFT_S signals on leads 258a and 258b, respectively, would be a pair of clocks of opposite phases. Conversely, if FCE 357 were programmed logic HIGH, circuit 30 would not be responsive to SHIFT_CLK and a logic LOW would be asserted on leads 258a and 258b, thereby disabling the shifting operation.

Figure 3B:
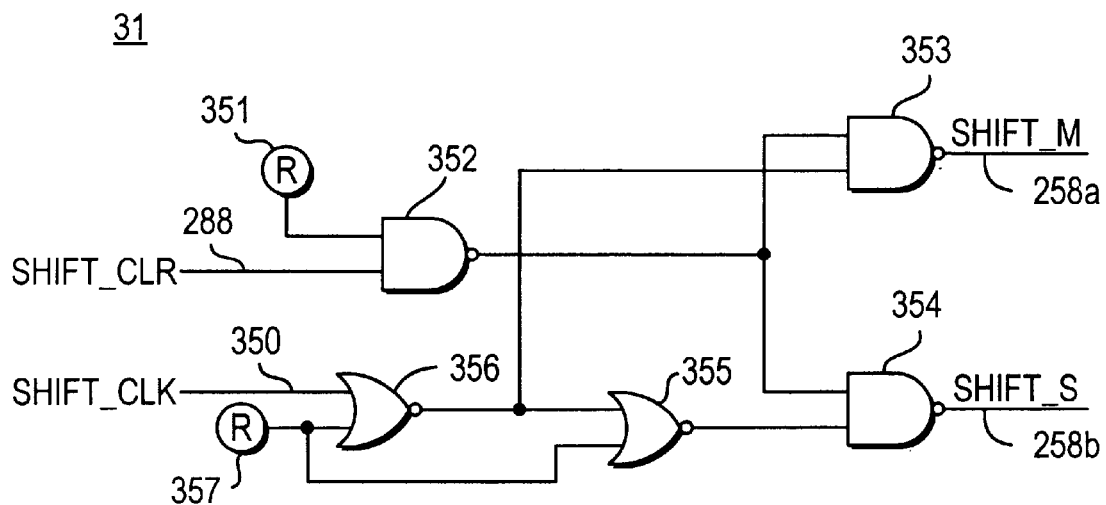

A variation of circuit 30 in FIG. 3a is shown in FIG. 3b, which features a circuit 31 that may be appropriate for use in initializing (i.e., clearing) the shift-registers implemented during memory mode. Circuit 31 may include an FCE 351 which, depending on its logic state, allows circuit 31 to be responsive to the SHIFT_CLR signal provided on lead 288.

When FCE 351 is set to logic HIGH, SHIFT_CLR may be used to control whether the signals applied on leads 258a/b is a two-phase clock or a control signal that is applied to the shift-registers for clearing. In the embodiment shown in FIG. 3b, when SHIFT_CLR is logic LOW, a pair of opposite-phase clocks, SHIFT_M and SHIFT_S, is applied on leads 258a and 258b, respectively. Conversely, when SHIFT_CLR is logic HIGH, a logic HIGH signal is applied on leads 258a/b, which may be used for shift-register clearing operations (this will be discussed later).

The circuits shown in FIGS. 3a and 3b have been presented merely for the purpose of illustration; other embodiments that possess similar functional characteristics may be used in accordance with the principles of the present invention. In some applications, for example, it may be appropriate to further modify the circuits featured in FIGS. 3a and/or 3b such that a specific non-overlap delay (which may be static or programmably variable) exists between the two clock phases, SHIFT_M and SHIFT_S.

Figure 3C:
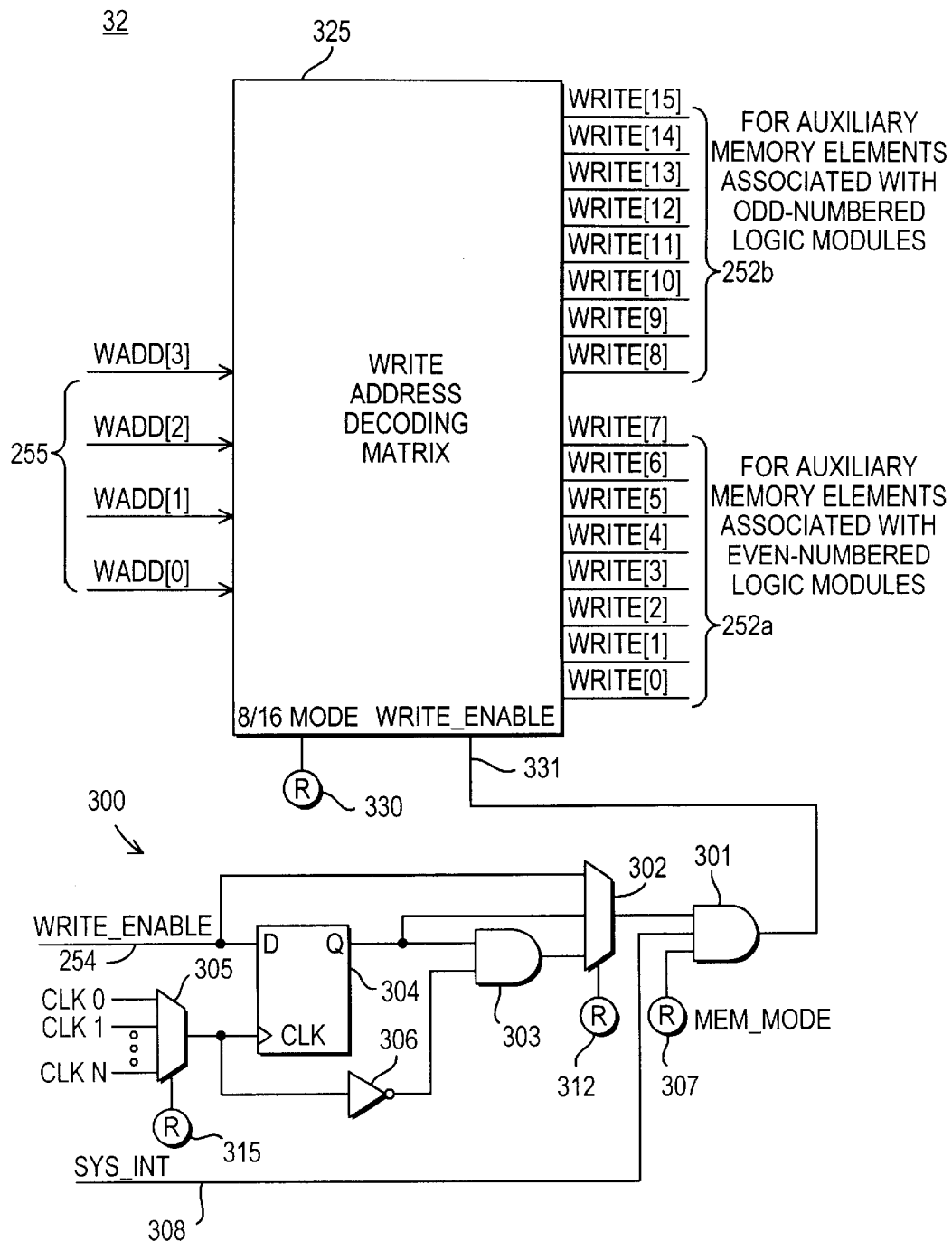
FIG. 3c is a simplified block diagram of another circuit which may be used in the logic array block of FIG. 2.

FIG. 3c shows one implementation of a write decoder 32 that may be included in memory mode control circuitry 250. Write decoder 32 has a write address decoding matrix 325 that decodes WADD[3:0] (the 4-bit write address for the RAM blocks implemented during memory mode) into the previously-mentioned WRITE[7:0] and WRITE[15:8] signals applied on leads 252a and 252b, respectively. In one embodiment, WRITE[7:0] is applied to the auxiliary memory elements 290 that are associated with the even-numbered logic modules 240 (e.g., LM_0, LM_2, etc.), whereas WRITE[15:8] is applied to the auxiliary memory elements 290 that are associated with the odd-numbered logic modules 240 (e.g., LM_1, LM_3, etc.)

In accordance with the principles of the present invention, using separate sets of WRITE signals for the auxiliary memory elements 290 associated with the odd- and even-numbered logic modules facilitates the operation of LAB 200 either as a set of 8-bit RAM blocks or as a set of 16-bit RAM blocks. When LAB 200 is operated as a set of 8-bit RAM blocks, wherein each 8-bit RAM block is implemented by a single auxiliary memory element 290, WRITE[7:0] and WRITE[15:8] have the same values. When LAB 200 is operated as a set of 16-bit RAM blocks, wherein each 16-bit RAM block is implemented with a pair of adjacent auxiliary memory elements 290, WRITE[7:0] and WRITE[15:8] may be collectively used as a 16-bit WRITE[15:0] signal.

In view of the above-mentioned capability of implementing either 8-bit or 16-bit RAM blocks within LAB 200, write address decoding matrix 325 may be responsive to a 8/16 MODE bit, provided by FCE 330, which may be indicative of whether the RAM blocks implemented within LAB 200 have a depth of 8-bits or 16-bits. When implementing 8-bit RAM blocks, the logic value on FCE 330 may be set to one of two binary values such that write address decoding matrix 325 is configured to output the same signals for both WRITE[7:0] and WRITE[15:8]. Conversely, when implementing 16-bit RAM blocks, the logic value on FCE 330 may be set to the other of the two binary values such that write address decoding matrix 325 is configured to output a 16-bit WRITE[15:0] signal that is used to select a bit location within a pair of auxiliary memory elements 290 that collectively implement a 16-bit RAM block. When addressing a 16-bit RAM block thus implemented, WRITE[7:0] may be used to access the bit locations in the auxiliary memory element 290 in the pair that is associated with the even-numbered logic module 240, while WRITE[15:8] may be used to access the bit locations in the auxiliary memory element 290 that is associated with the odd-numbered logic module 240.

Write decoder 32 may further include a write control circuit 300 that may be responsive to a MEM_MODE bit on FCE 307, which may be indicative of whether LAB 200 is being operated in logic mode or in memory mode. For example, when MEM_MODE is logic LOW, write decoder 32 is disabled and LAB 200 may be operated in logic mode. When MEM_MODE is logic HIGH, write decoder 32 is operative and may be used to decode WADD[3:0] on leads 255, depending on the level of the WRITE_ENABLE signal on lead 254. When WRITE_ENABLE is logic LOW, none of the WRITE signals on leads 252a/b may be asserted. Conversely, when WRITE_ENABLE is logic HIGH, WADD[3:0] may be decoded to assert the appropriate WRITE signals on leads 252a/b. In accordance with the principles of the present invention, the RAM blocks that are implemented within LAB 200 during memory mode may be programmably selectively operable in both synchronous and asynchronous modes. Accordingly, the WRITE_ENABLE signal that is conveyed to write address decoding matrix 325 via lead 331 may either be a synchronous or an asynchronous signal, depending on the configuration of programmable logic connector (PLC) 302. When PLC 302 is configured for synchronous operation, the WRITE_ENABLE signal on lead 254 may be passed through a flip-flop 304 that may be clocked by any one of a plurality of clocks (e.g., CLK0 ... CLKN) that may be selectable via PLC 305. These selectable clocks may be derived from the K different clock inputs provided on CLK_IN leads 259 (see FIG. 2). When PLC 302 is configured for asynchronous operation, the WRITE_ENABLE signal on lead 254 bypasses the above-described flip-flop circuitry. Write control circuit 300 may also be responsive to a SYS_INIT signal on lead 308 which may be asserted to ensure that any residual and/or transient signals within write decoder 32 have settled prior to operation.

Figure 4:
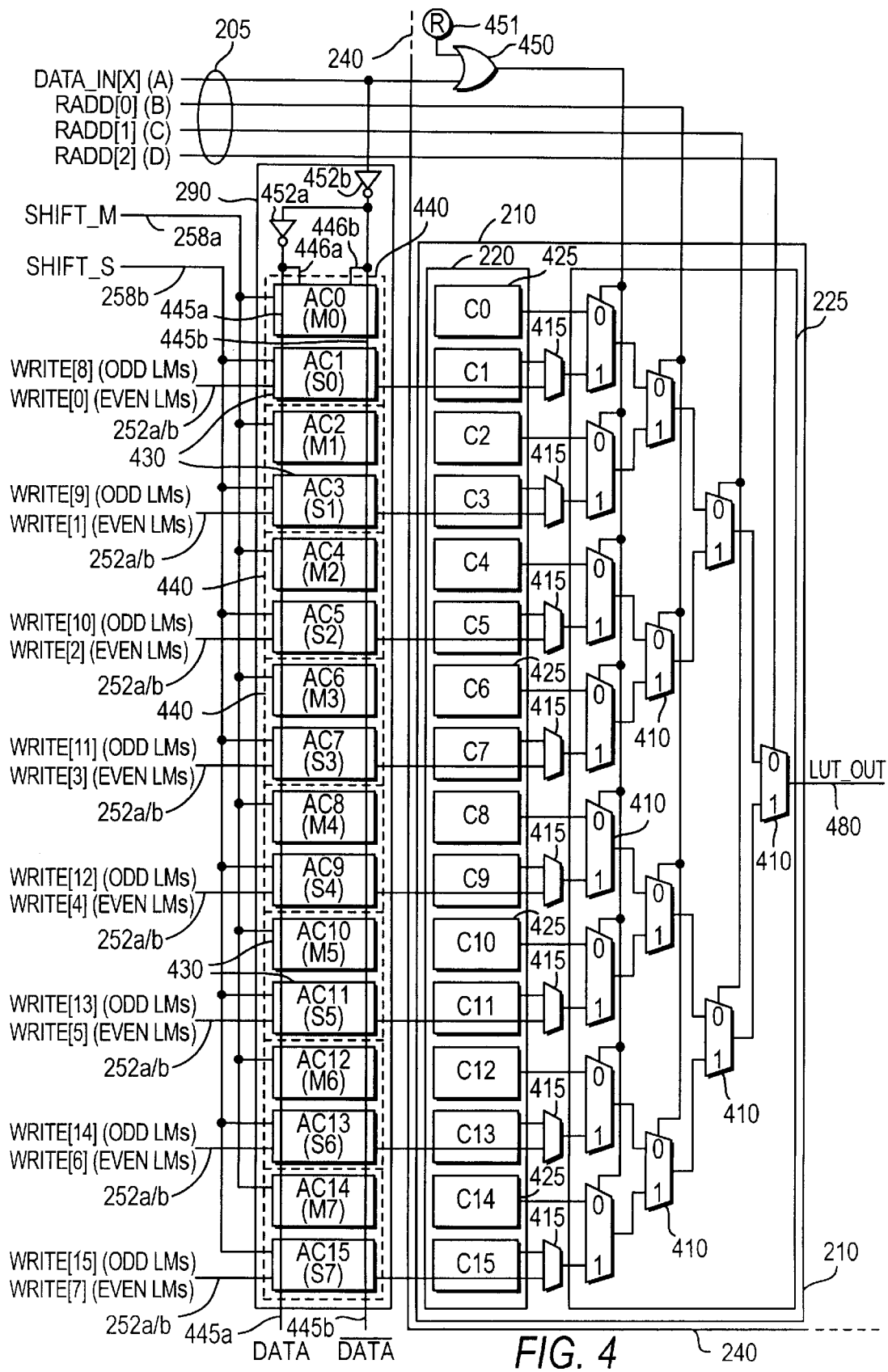
FIG. 4 shows a portion of the logic array block of FIG. 2 in greater detail.

FIG. 4 shows in greater detail an auxiliary memory element 290 and a portion of its associated logic module 240 that may be involved in the read and write operations of the associated auxiliary memory element 290 during memory mode. As shown in FIG. 4, auxiliary memory element 290 may be coupled to logic module 240 such that, during memory mode, data stored within auxiliary memory element 290 may be read using the LUT read circuit 225 within its associated logic module 240. For the purpose of illustration, LUT read circuit 225 is functionally represented in FIG. 4 as a tree of multiplexers; however, any conventional LUT read circuit may be used. In accordance with the principles of the present invention, LUT read circuit 225 is usable during both logic and memory modes: during logic mode, LUT read circuit 225 may be used to read the LUT configuration memory 220; during memory mode, the LUT read circuit 225 may be used to read the auxiliary memory element 290. By using LUT read circuit 225 in both operating modes of LAB 200, reading from auxiliary memory element 290 during memory mode may be accomplished with minimal additional read circuitry.

As mentioned previously, the (A) LUT input lead 205 of logic module 240 may be used as a data input, while the (B), (C), and (D) LUT input leads 205 may be used to provide read addresses for auxiliary memory element 290 during memory mode. In this particular arrangement, the maximum effective bit depth of a shift-register or a RAM block implemented with a single auxiliary memory element 290 would be eight. The structure of one embodiment of an auxiliary memory element 290 having a maximum effective storage capacity of eight bits when used either as a shift-register or as a RAM block is schematically represented in FIG. 4 as a 16×1 array of auxiliary memory cells 430, designated AC0–AC15.

When auxiliary memory element 290 is configured for use as a shift-register, the sixteen auxiliary memory cells 430 may be arranged as eight master/slave pairs 440 (designated M0/S0, M1/S1, etc.) that may effectively function as eight shift-register bits. Data in the 8-bit shift-register thus implemented may be read from the slave cells (S0, S1, S2 ... S7), which correspond to the odd-numbered auxiliary memory cells 430 (AC1, AC3, AC5 ... AC15). When auxiliary memory element 290 is configured for use as an 8-bit RAM block, these odd-numbered auxiliary memory cells 430 (AC1, AC3, AC5 ... AC15) may be used as RAM cells.

In both the shift-register and the RAM block implementations, the contents of the eight odd-numbered auxiliary memory cells 430 (AC1, AC3, AC5 ... AC15) within auxiliary memory element 290 may be read using LUT read circuit 225. As shown in FIG. 4, the output of each of these odd-numbered auxiliary memory cells 430 is passed through a programmable multiplexer 415, which multiplexes the output of an odd-numbered auxiliary memory cell 430 with the output of a corresponding LUT memory cell 425 (C1, C3, C5 ... C15) within LUT configuration memory 220. The output of programmable multiplexer 415 is applied as one of the sixteen data inputs to the LUT read circuit 225 such that the contents of either an auxiliary memory cell 430 or a LUT memory cell 425 may be programmably selectively accessed using the LUT read circuit 225.

In order to allow LUT read circuit 225 to properly interpret a 3-bit read address provided on the (B), (C), and (D) LUT input leads 205 during memory mode, the (A) input lead 205 may be coupled to control logic, such as an OR gate 450 having an FCE 451, that controls whether the LUT read circuit 225 is responsive to the signals applied to the (A) LUT input lead 205. For the purpose of illustrating how the bit value of FCE 451 may change the operational behavior of LUT read circuit 225, LUT read circuit 225 is functionally represented in FIG. 4 as a tree of multiplexers 410, in which each layer of multiplexers 410 is controlled by one of the four LUT input leads 205, and wherein the signals on the (A) LUT input lead 205 control the layer of multiplexers 410 that multiplex the sixteen data inputs (e.g., the outputs of the LUT memory cells 425 and the programmable multiplexers 415) of the LUT read circuit 225.

When LAB 200 is to be operated in logic mode, FCE 451 may be set to logic LOW in order to allow LUT read circuit 225 to be responsive to the signal on the (A) LUT input lead 205 such that a 4-bit read address applied on all four LUT input leads 205 may be properly decoded by LUT read circuit 225 to access any one of sixteen bit locations within LUT configuration memory 220. When LAB 200 is to be operated in memory mode, however, FCE 451 may be set to logic HIGH in order to configure the layer of multiplexers 410 that are associated with the (A) LUT input lead 205 to pass the output of programmable multiplexer 415 regardless of the signal on the (A) LUT input lead, which may be used as a data input to auxiliary memory element 290.

When auxiliary memory element 290 is configured as a shift-register during memory mode, the data supplied via the (A) LUT input lead 205 may be provided in true and complement form via conductors 446a and 446b, respectively, to the first auxiliary memory cell 430 (AC0), from which it may be shifted to the last auxiliary memory cell 430 (AC15). When auxiliary memory element 290 is configured as a RAM block during memory mode, the data supplied via the (A) LUT input lead 205 may be provided in true and complement form via conductors 445a and 445b, respectively, to the odd-numbered auxiliary memory cells (AC1, AC3, AC5 . . . AC15), each of which may be responsive to a WRITE signal. Depending on whether these odd-numbered auxiliary memory cells 430 are associated with an even-numbered or an odd-numbered logic module 240, either WRITE[7:0] or WRITE[15:8] may be used to control the write operations in those cells.

Figure 5:
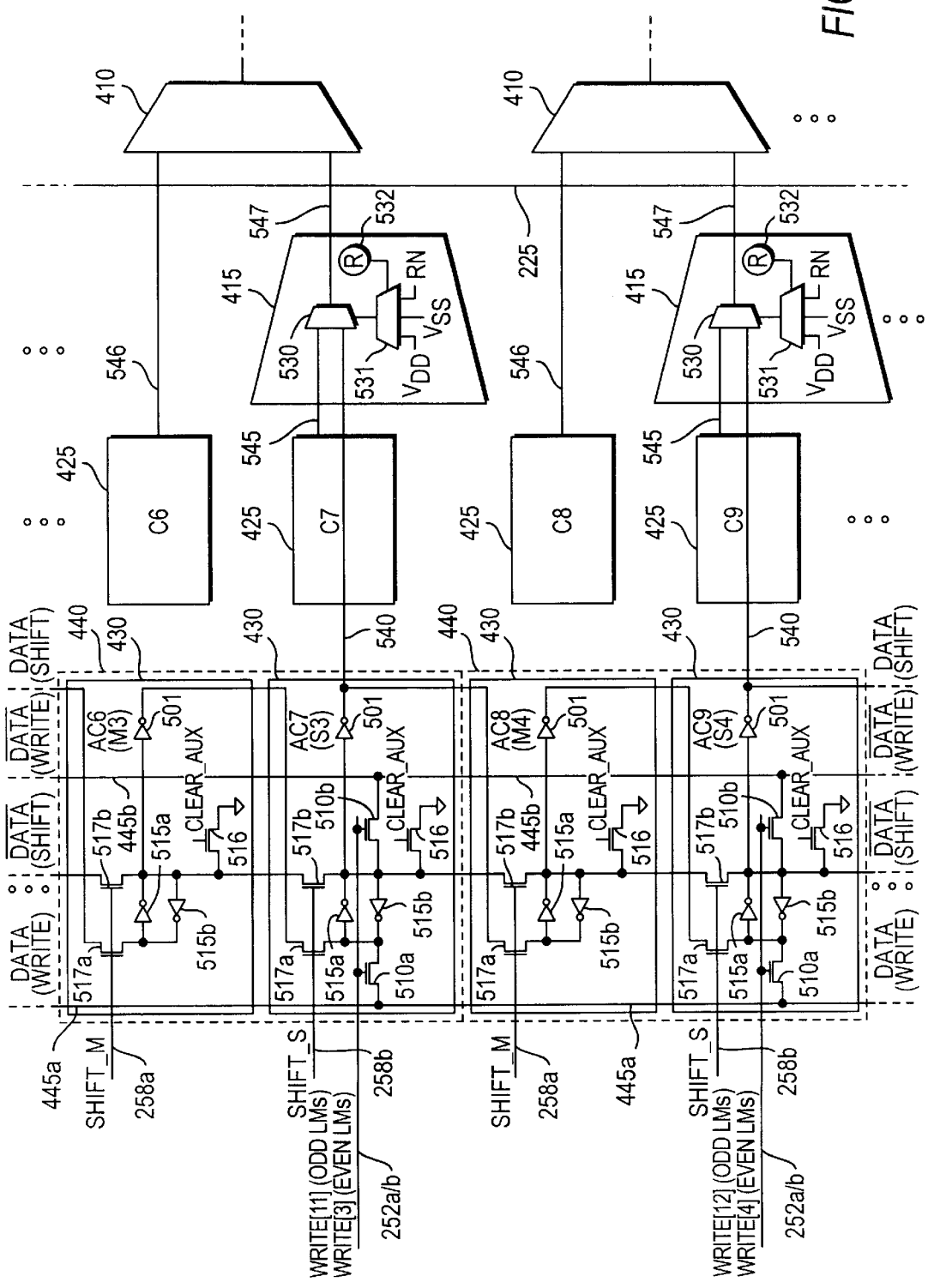
FIG. 5 shows an aspect of FIG. 4 in greater detail.

In order to further illustrate the operation of auxiliary memory element 290 as either a shift-register or as a RAM block during memory mode, FIG. 5 shows in greater detail the structure of four of the sixteen auxiliary memory cells 430 (AC6, AC7, AC8, and AC9), and their arrangement with respect to a set of corresponding LUT memory cells 425 (C6, C7, C8, and C9), and their associated programmable multiplexers 415.

For use in implementing a shift-register during memory mode, each auxiliary memory cell 430 has a pair of pass gates 517a/b that may be used to shift data from one auxiliary memory cell 430 to the next auxiliary memory cell 430. The respective pass gates 517a/b within each master/slave pair of auxiliary memory cells 430 are clocked by SHIFT_M and SHIFT_S on leads 258a/b, which may be generated, as described previously, either by circuit 30 in FIG. 3a or by circuit 31 in FIG. 3b.

The shift-register implemented by auxiliary memory element 290 may be cleared in a variety of ways in accordance with the purposes of the present invention. In one embodiment, as shown in FIG. 5, each auxiliary memory cell 430 may have a clearing pass transistor 516 that is responsive to a CLEAR_AUX signal. The assertion of CLEAR_AUX allows the contents of every auxiliary memory cell 430 within auxiliary memory element 290 to be initialized. The CLEAR_AUX signal may or may not be the same as the clearing signal that is used to clear the contents of the LUT memory cells 425. In those embodiments in which circuit 31 in FIG. 3b is used to generate SHIFT_M and SHIFT_S, the contents of the shift-register may also be cleared by setting SHIFT_CLR (shown in FIG. 3b) to logic HIGH (assuming FCE 351 is set to logic HIGH). When SHIFT_CLR is logic HIGH, a logic HIGH may be applied on leads 258a/b (instead of a pair of opposite-phase clock signals), which opens all the latches within the shift-register by turning on all the pass gates 517a/b. As a result, an initialization logic value may be passed through all the latches, thereby clearing the shift-register.

The bit value contained within any of the eight shift-register stages (i.e., master/slave pairings) implemented within auxiliary memory element 290 may be accessed by reading the contents of the slave cells, which, as described previously, correspond to the odd-numbered auxiliary memory cells 430. As illustrated in FIG. 5, the output of each slave cell is conveyed on lead 540 to an associated programmable multiplexer 415. Programmable multiplexer 415 may include an input multiplexer 530 that may be configured to programmably selectively convey either the output of an auxiliary memory cell 430 on lead 540 or the output of a LUT memory cell 425 on lead 545 as an input to LUT read circuit 225 on lead 547. In order to programmably configure input multiplexer 530, programmable multiplexer 415 may further include a control multiplexer 531. Control multiplexer 531 may be programmable using FCE 532, which may be used to select a control signal for input multiplexer 530. The control signals may be chosen from a variety of sources, including $V_{DD}$, $V_{SS}$, and/or at least one signal from the routing network, designated RN. With this arrangement, input multiplexer 530 may be controllable either by a static signal (i.e., when FCE 532 is programmed to select either $V_{DD}$ or $V_{SS}$) or by any of a variety of dynamic logic signals that may be produced within the programmable logic device that includes LAB 200 (i.e., when FCE 532 is programmed to select an input from the routing network).

In accordance with the principles of the present invention, the output signal of a given logic module 240 may be derived either from its associated LUT configuration memory 220 or its associated auxiliary memory element 290 by multiplexing the input of LUT read circuit 225 with a set of programmable multiplexers 415. For the purposes of the present invention, an alternative arrangement may be used in which a separate auxiliary read circuit for the auxiliary memory element 290 may be provided such that a single multiplexer may be used to multiplex the respective outputs of the LUT read circuit 225 and the auxiliary read circuit, instead of using a set of programmable multiplexers 415 to multiplex the respective outputs of the LUT memory cells 425 with their corresponding auxiliary memory cells 430, in allowing the output signal of a logic module 240 to be derived from either the LUT configuration memory 220 or its associated auxiliary memory element 290.

When auxiliary memory element 290 is operated as a RAM block during memory mode, pass gates 517a/b, which are used during the shift-register implementation to shift data from one auxiliary memory cell 430 to the next auxiliary memory cell 430, are disabled such that the auxiliary memory cells 430 are disconnected from one another. This may be accomplished by setting FCE 357 associated with circuits 30/31 in FIGS. 3a/3b to logic HIGH, such that a logic LOW may be applied on leads 258a/b, thereby turning off pass gates 517a/b within each auxiliary memory cell 430.

During operation of auxiliary memory element 290 as a RAM block, the odd-numbered auxiliary memory cells 430 (AC1, AC3 . . . AC15), which may function as the slave cells in each master/slave latch pair 440 during the shift-register implementation, may be used as the RAM cells during the RAM block implementation. Accordingly, the read operation for the RAM block is similar to the read operation for the shift-register, in which the outputs of the odd-numbered auxiliary memory cells 430 are passed to the LUT read circuit 225 via programmable multiplexer 415. In order to write to these odd-numbered auxiliary memory cells 430 when auxiliary memory element 290 is configured for use as a RAM block, each odd-numbered auxiliary memory cell 430 may include a pair of pass transistors 510a/b. Each pair of pass transistors 510a/b may be coupled to a WRITE signal lead 252a/b such that when the associated WRITE signal is asserted, the true and complementary values on leads 445a/b of a bit value applied to the (A) LUT input lead 205 may be stored in inverter pair 515a/b. As in the shift-register implementation, the contents of the RAM block may be cleared via pass transistor 516.

Figure 6:
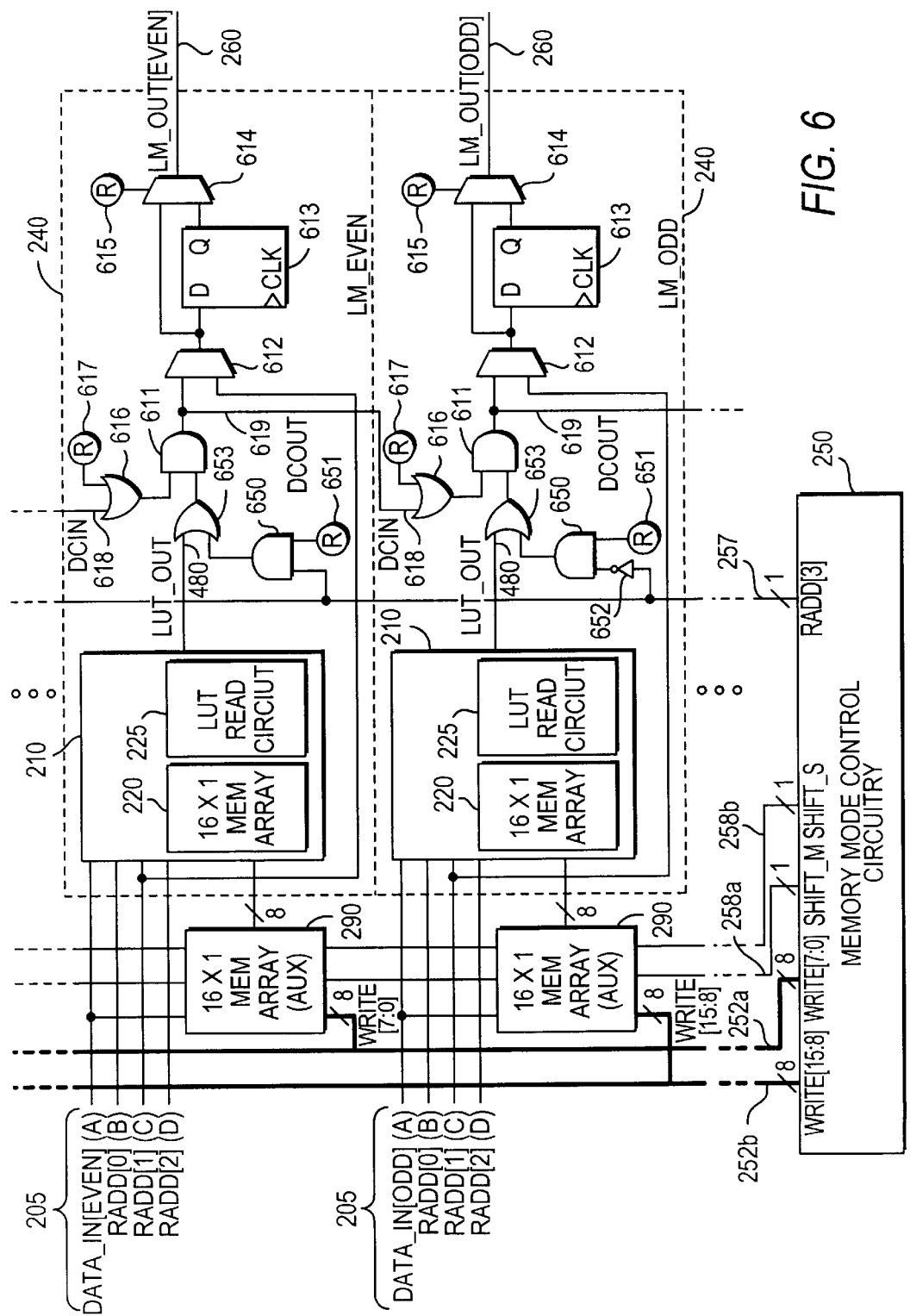
FIG. 6 shows an aspect of the logic array block of FIG. 2 in greater detail.

As previously mentioned, two auxiliary memory elements 290 may be collectively operated either as a 16-bit shift-register or as a 16-bit RAM block during memory mode. This arrangement is illustrated in greater detail in FIG. 6, which focuses on a pair of adjacent even- and odd-numbered logic modules 240, designated LM_EVEN and LM_ODD, respectively, within LAB 200. FIG. 6 shows that, in addition to 16-bit LUT 210, each logic module 240 within LAB 200 may also include direct-connect circuitry (which will be described later), and an output control PLC 614 that allows the signal on LM_OUT lead 260 to be either a registered signal or a combinatorial signal. In order to form a shift-register that is 16-bits deep with a pair of auxiliary memory elements 290, each having an effective depth of eight bits, the combinatorial (i.e., unregistered) output of LM_EVEN on lead 260 is applied to the data input lead (i.e., the (A) LUT input lead 205) of LM_ODD such that the 8-bit shift-registers implemented with the auxiliary memory elements 290 associated with LM_EVEN and LM_ODD may be serially cascaded. The output of the 16-bit shift-register thus created is the combinatorial output of LM_ODD. If the registered output of a logic module 240 were to be used instead of the combinatorial (i.e., unregistered) output during shift-register operation, the shift-register that would be implemented by that logic module 240 and its associated auxiliary memory element 290 would have a maximum effective depth of nine bits, rather than eight (register 613 acts like an extra shift-register stage). As a result, a shift-register that has a maximum effective depth of 18 bits may be formed by cascading a pair of auxiliary memory elements 290 through the registered outputs of their associated logic modules 240.

In order to read from a 16-bit shift-register implemented by LM_EVEN and LM_ODD, a fourth read address bit, RADD[3], may be used in addition to the three read address bits, RADD[2:0], that are supplied to the respective LUT read circuits 225 within LM EVEN and LM_ODD. As in the 8-bit shift-register implementation, RADD[2:0] may be used by the respective LUT read circuits 225 of LM_EVEN and LM_ODD to access specific bit locations within their associated auxiliary memory elements 290. The contents of the bit locations thus accessed are applied on the associated LUT_OUT leads 480 within LM_EVEN and LM_ODD. An additional read bit, RADD[3], may then be used to introduce an additional level of selection between the LUT_OUT signals associated with LM_EVEN and LM_ODD and their respective auxiliary memory elements 290. With this arrangement, any bit location within a 16-bit shift-register that is collectively implemented by a pair of auxiliary memory elements 290 and their associated logic modules 240 may be read.

The selection of the LUT_OUT signals using RADD[3] may be accomplished through the use of direct-connect circuits within the logic modules 240 associated with the pair of auxiliary memory elements 290 implementing the 16-bit shift-register. As illustrated in FIG. 6, the direct-connect circuits are structured to allow the respective LUT_OUT signals of adjacent logic modules 240 to be logically combined without using the programmable interconnection network to convey the LUT_OUT signals between adjacent logic modules 240. Each direct-connect circuit may include a DCIN OR-gate 616, a DCOUT AND-gate 611, a LUT_OUT OR-gate 653, and an address control AND-gate 650. DCIN OR-gate 616 has a DCIN input lead 618, on which a LUT_OUT signal from a previous logic module 240 may be supplied, and an FCE 617, which may be used to control whether the associated logic module 240 is responsive to signals applied on DCIN input lead 618. Depending on the configuration of LUT_OUT OR-gate 653, the output of DCIN OR-gate 616 may be logically combined with the LUT_OUT signal by DCOUT AND-gate 611. The output of DCOUT AND-gate 611 may be made available on lead 619 as a DCOUT signal, which may serve as the DCIN signal for a successive logic module 240.

As shown in FIG. 6, the respective direct-connect circuits within LM_EVEN and LM_ODD may be configured to be responsive to the RADD[3] signal, such that RADD[3] controls the selection of either the LUT_OUT signal of LM_EVEN or the LUT_OUT signal of LM_ODD as the bit value indicative of the contents of the bit location within the 16-bit shift-register that has been addressed by a 4-bit read address, RADD[3:0]. In the arrangement shown in FIG. 6, the respective direct-connect circuits of LM_EVEN and LM_ODD are configured such that the LUT_OUT signal that is selected according to RADD[3] is made available as a logic module output signal on lead 260 of LM_ODD.

In order for the direct-connect circuit of LM_EVEN to be responsive to RADD[3] on lead 257, the FCE 651 associated with address control AND-gate 650 is set to logic HIGH. Because the read output signal for the 16-bit shift-register implementation involving LM_EVEN and LM_ODD is provided as an output of LM_ODD, the direct-connect circuit of LM_EVEN is not responsive to its associated DCIN signal on lead 618. Accordingly, the FCE 617 within LM_EVEN that controls DCIN OR-gate 616 may be set to logic HIGH such that the output of DCOUT AND-gate 611 reflects changes in RADD[3] and the LUT_OUT signal on lead 480. The output of DCOUT AND-gate 611 of LM_EVEN is applied to DCOUT lead 619 for application as a DCIN signal on lead 618 of LM_ODD. Unlike LM_EVEN, the direct-connect circuit of LM_ODD is responsive to the logic values on its associated DCIN lead 618. Accordingly, the value of FCE 617 in LM_ODD is set to logic LOW. As in LM_EVEN, the direct-connect circuit within LM_ODD is responsive to the RADD[3] signal on lead 257. The logic value of FCE 651 in LM_ODD is therefore set to logic HIGH.

Through the collective operation of the direct-connect circuits within LM_EVEN and LM_ODD, the application of the respective LUT_OUT signals of either LM_EVEN or LM_ODD on the LM_OUT lead 260 of LM_ODD may be accomplished based on the logic level of RADD[3]. When RADD[3] is logic LOW, the signal on LM_OUT lead 260 of LM_ODD may reflect the LUT_OUT signal of LM_EVEN. Conversely, when RADD[3] is logic HIGH, the signal on LM_OUT lead 260 of LM_ODD may reflect the LUT_OUT signal of LM_ODD. For example, if RADD[3:0]=0011 were used to address the 16-bit shift-register implemented by the auxiliary memory elements 290 associated with LM_EVEN and LM_ODD, the contents of the auxiliary memory cell 430 designated AC7 in the auxiliary memory element 290 associated with LM_EVEN may be made available as the output of LM_ODD. Similarly, if RADD[3:0]=1011 were used, the contents of the auxiliary memory cell 430 designated AC7 in the auxiliary memory element associated with LM_ODD may be made available as the output of LM_ODD.

When a pair of auxiliary memory elements 290 are collectively configured for use as a 16-bit RAM block, the read operation is similar to the read operation for the 16-bit shift-register operation, as described in the immediately preceding paragraphs. The write operation for the 16-bit RAM block involves collectively addressing the auxiliary memory elements 290 associated with LM_EVEN and LM_ODD with a 16-bit WRITE[15:0] signal. As mentioned previously, WRITE[7:0] is applied to the auxiliary memory elements 290 that are associated with the even-numbered logic modules 240 (e.g., LM_0, LM_2, etc.), whereas WRITE[15:8] is applied to the auxiliary memory elements 290 that are associated with the odd-numbered logic modules 240 (e.g., LM_1, LM_3, etc.). When LAB 200 is operated as a set of 8-bit RAM blocks, wherein each 8-bit RAM block is implemented by a single auxiliary memory element 290, WRITE[7:0] and WRITE[15:8] may have the same values. When configured for 16-bit operation, however, WRITE[7:0] and WRITE[15:8] are collectively used as a 16-bit WRITE[15:0] signal. As illustrated in FIG.

6, for example, in order to write to a 16-bit RAM block implemented by LM_EVEN and LM_ODD and their associated auxiliary memory elements 290, one of the WRITE [7:0] signals would be asserted when writing to a bit location within the auxiliary memory element 290 associated with LM_EVEN, while one of the WRITE[15:8] signals would be asserted when writing to a bit location within the auxiliary memory element 290 associated with LM_ODD. Data to be written into the 16-bit RAM block may be supplied to the respective (A) LUT input leads 205 associated with LM_EVEN and LM_ODD.

Figure 7:
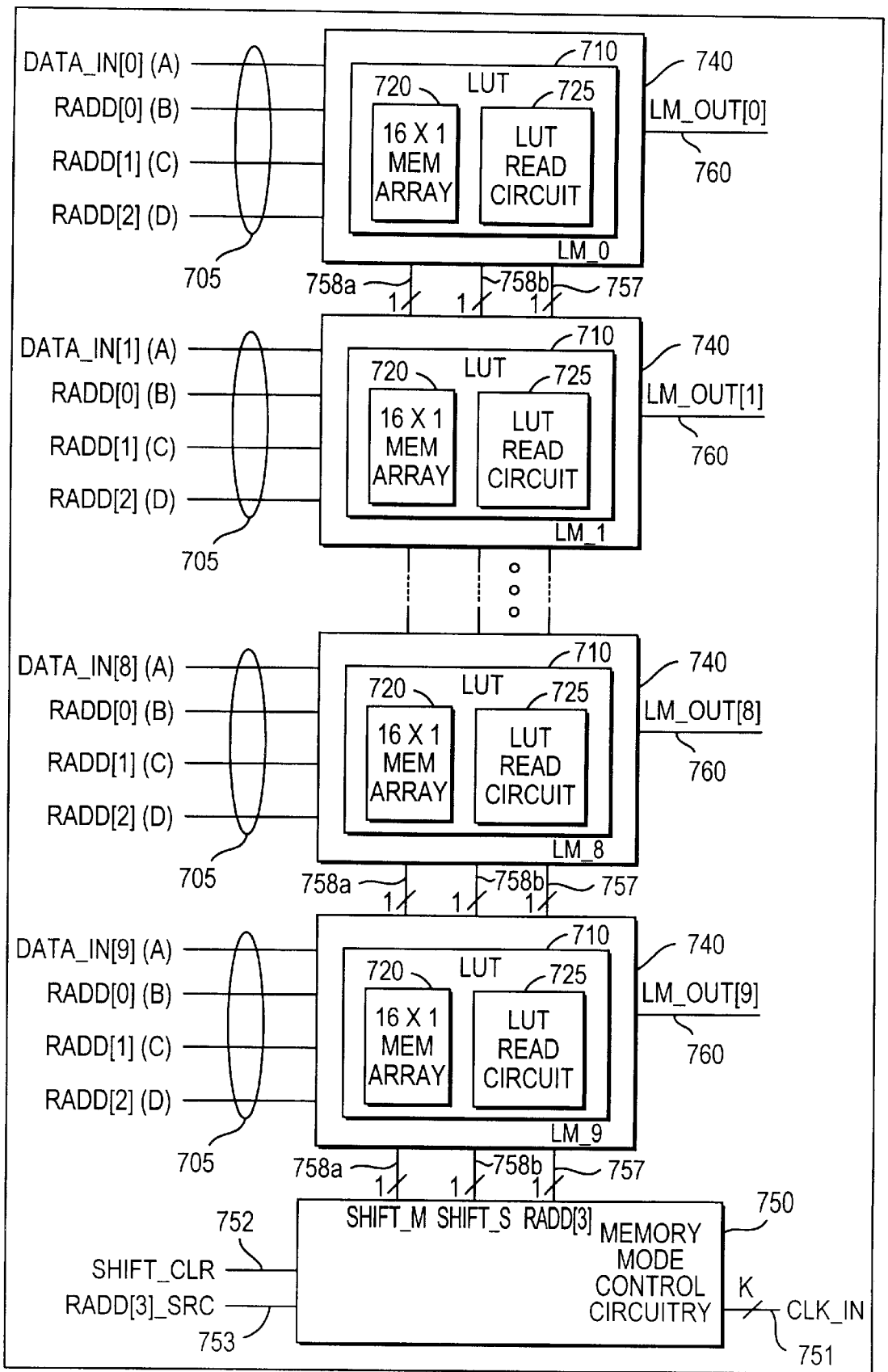
FIG. 7 is a simplified block diagram of an alternative logic array block that may be constructed in accordance with the principles of the present invention.

FIG. 7 shows an alternative embodiment of an improved LAB 700 which may be constructed in accordance with the principles of the present invention. As in the case of LAB 200, LAB 700 may be operated in either logic mode or in memory mode. In logic mode, LAB 700 may perform LUT-based logic functions, while in memory mode, each logic module 740 within LAB 700 may be configured for use as an 8-bit shift register. Unlike LAB 200, the 8-bit shift-registers within LAB 700 are not implemented with auxiliary memory elements. Rather, the shift-registers are implemented with the LUT configuration memories 720 within the logic modules 740. By using the LUT configuration memories 720 in both logic and memory modes, the auxiliary memory elements 290 of LAB 200, along with the various auxiliary circuits associated with the auxiliary memory elements 290 within each logic module 240, are not present in LAB 700. In a manner similar to configuring a 16×1 auxiliary memory element 290 in LAB 200, a 16×1 LUT configuration memory 720 may be configured as an 8-bit shift-register by using a pair of LUT memory cells to form a single shift-register bit, in which one LUT memory cell acts as the master latch and the other acts as the slave latch. Accordingly, up to eight shift-register data bits may be shifted into the LUT configuration memory 720 during memory mode, such that the LUT configuration memory 720 may be used during logic mode to implement any 3-input logic function.

As in LAB 200, the LUT input leads 705 of each logic module 740 within LAB 700 may be used to supply data and read addresses for the shift-register implemented within that logic module 740. The arrangement for reading the shift-registers implemented within LAB 700 is similar to the arrangement within LAB 200 such that the FIFO/LIFO implementations, 8-bit/16-bit operation, etc. that is possible within LAB 200 is also possible within LAB 700.

Figure 8:
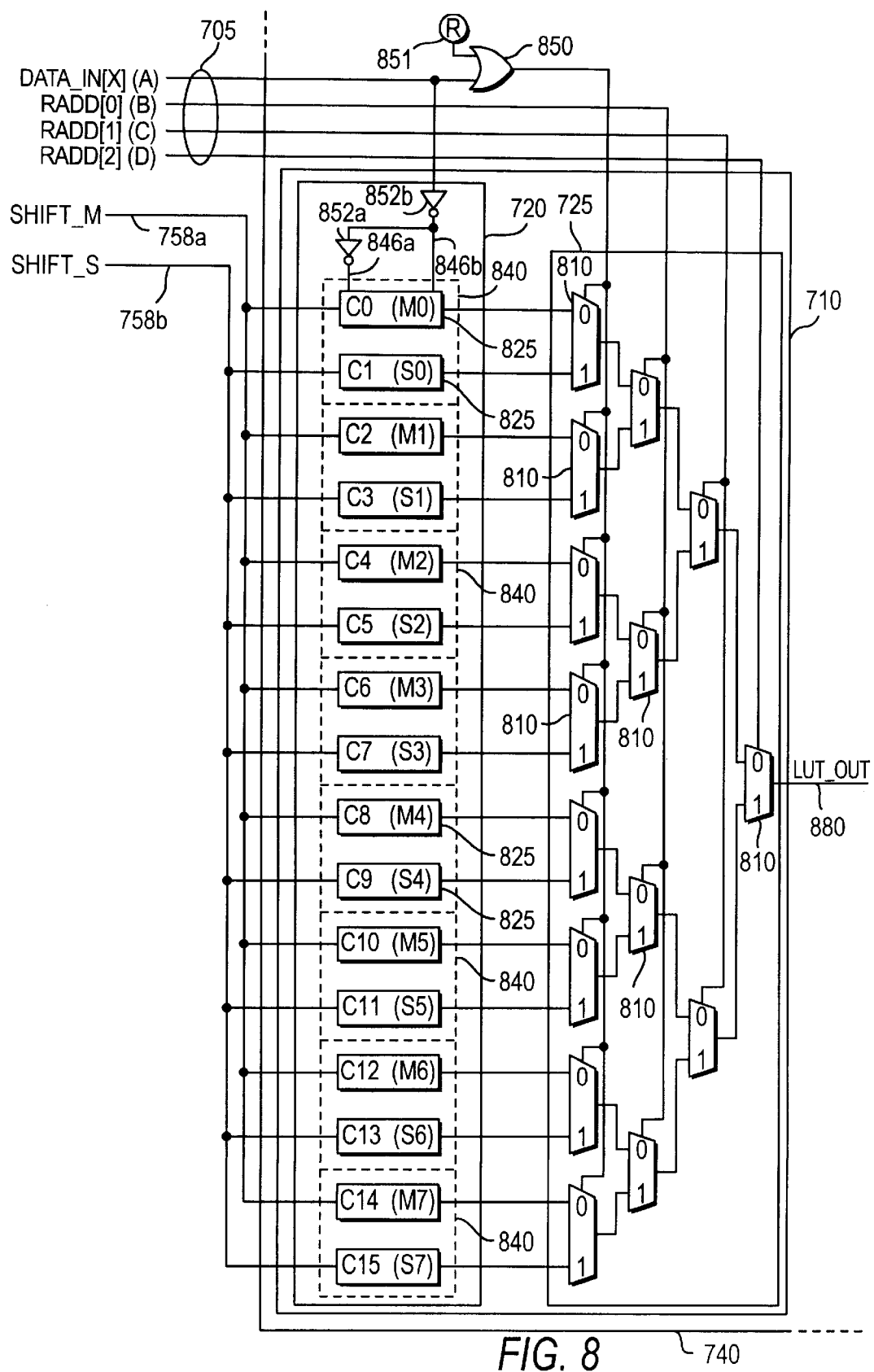
FIG. 8 shows a portion of the logic array block of FIG. 7 in greater detail.

FIG. 8 shows in greater detail a representative LUT configuration memory 720 and its associated LUT read circuit 725 that may be used within a logic module 740 in LAB 700. The 16-bit LUT configuration memory 720 includes sixteen memory cells 825 arranged in a 16×1 array. Whether in logic mode or in memory mode, the LUT configuration memory 720 may be accessed for reading via LUT read circuit 725. As in LAB 200, the (A) LUT input lead 705 of LUT read circuit 725 may be coupled to control logic (e.g., OR gate 850 and FCE 851) that allows the (A) LUT input lead 705 to be used as a data input while enabling LUT read circuit 725 to decode a 3-bit read address applied on the (B), (C), and (D) LUT input leads 705 for reading the contents of any of the eight shift-register bits during memory mode.

Figure 9:
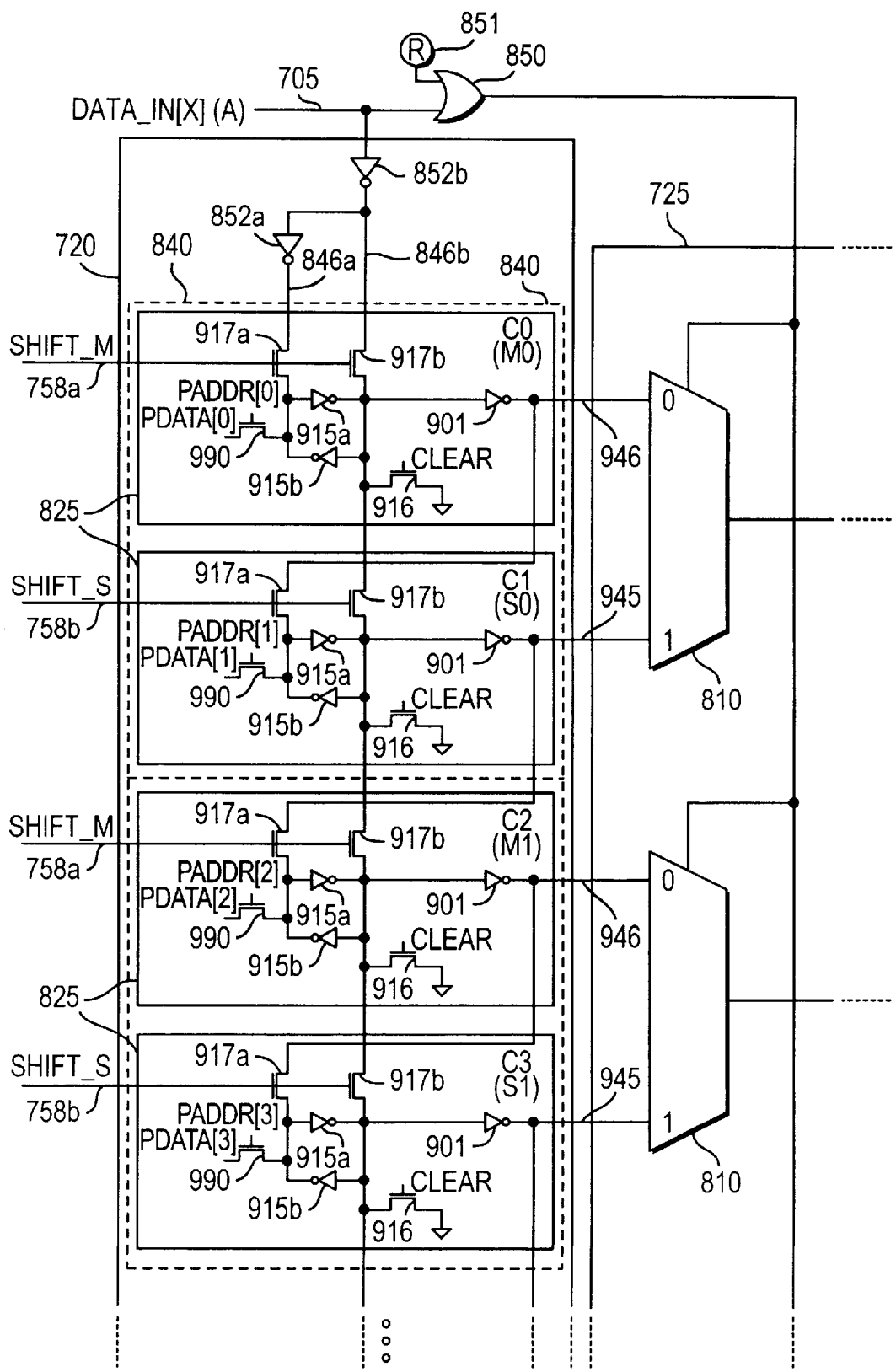
FIG. 9 shows an aspect of FIG. 8 in greater detail.

FIG. 9 focuses on a portion of FIG. 8 in order to show the LUT memory cells 825 in greater detail. In each LUT memory cell 825, a pair of inverters 915a/b performs the storage function. Each LUT memory cell 825 within LUT configuration memory 720 may include a pass transistor 916 that is responsive to a CLEAR signal for simultaneously clearing all the memory cells 825 within the associated LUT configuration memory 720. For use when programming the device that includes LAB 700, each LUT memory cell 825 may also have a pass transistor 990 through which LUT configuration data, PDATA, may be applied to inverter pair 915a/b upon asserting PADDR. When LUT configuration memory 720 is configured for operation as a shift-register, the shifting and clearing operations are similar to that of the shift-registers implemented with the auxiliary memory elements 290 in LAB 200.

Figure 10:
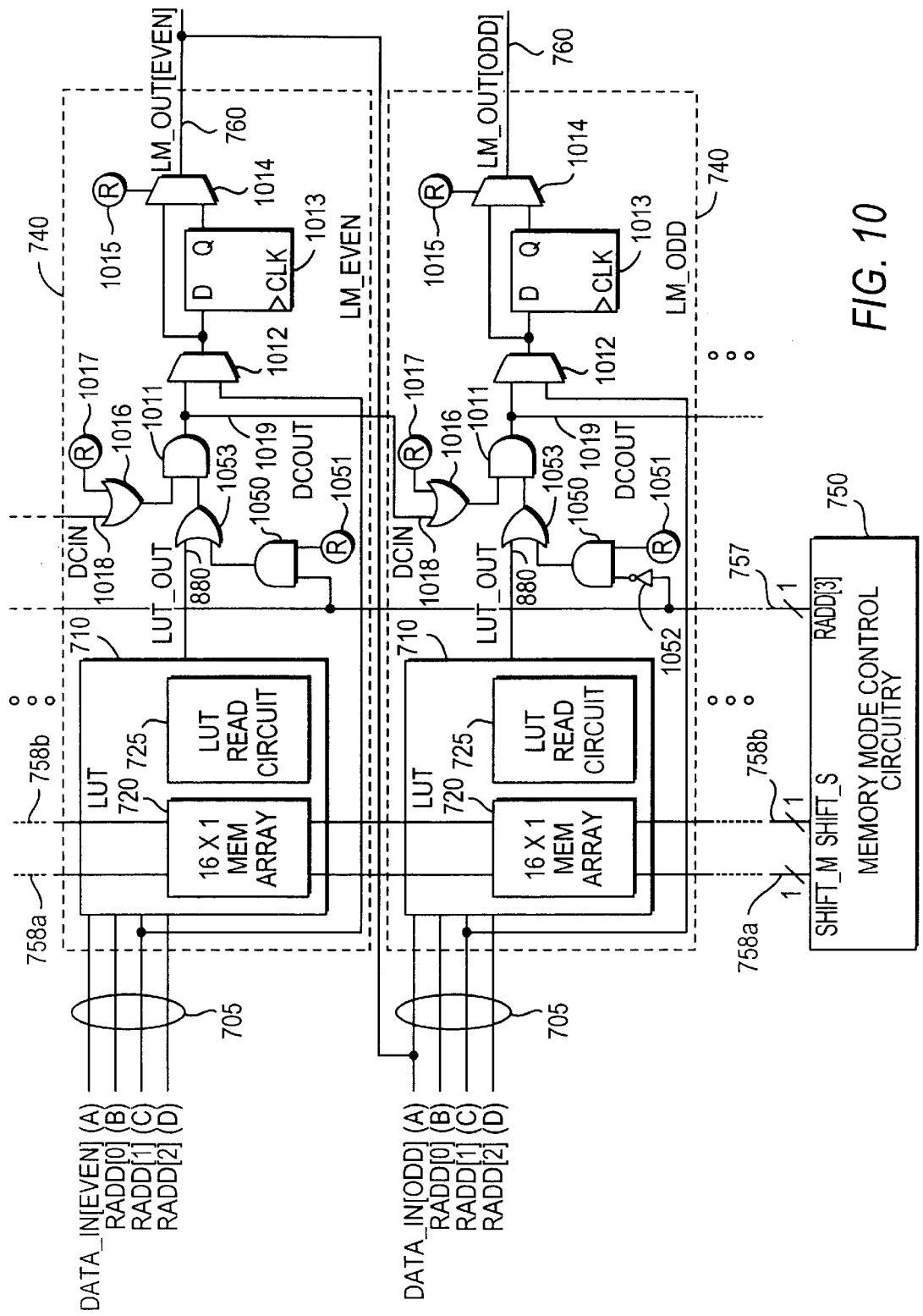
FIG. 10 shows an aspect of the logic array block of FIG. 7 in greater detail.

FIG. 10 shows how a 16-bit shift-register may be implemented with the LUT configuration memories 720 of a pair of logic modules 740. The use of the direct-connect circuits within the logic modules 740 and the fourth read address bit, RADD[3], is similar to that of the 16-bit shift-register implementation within LAB 200.

Figure 11:
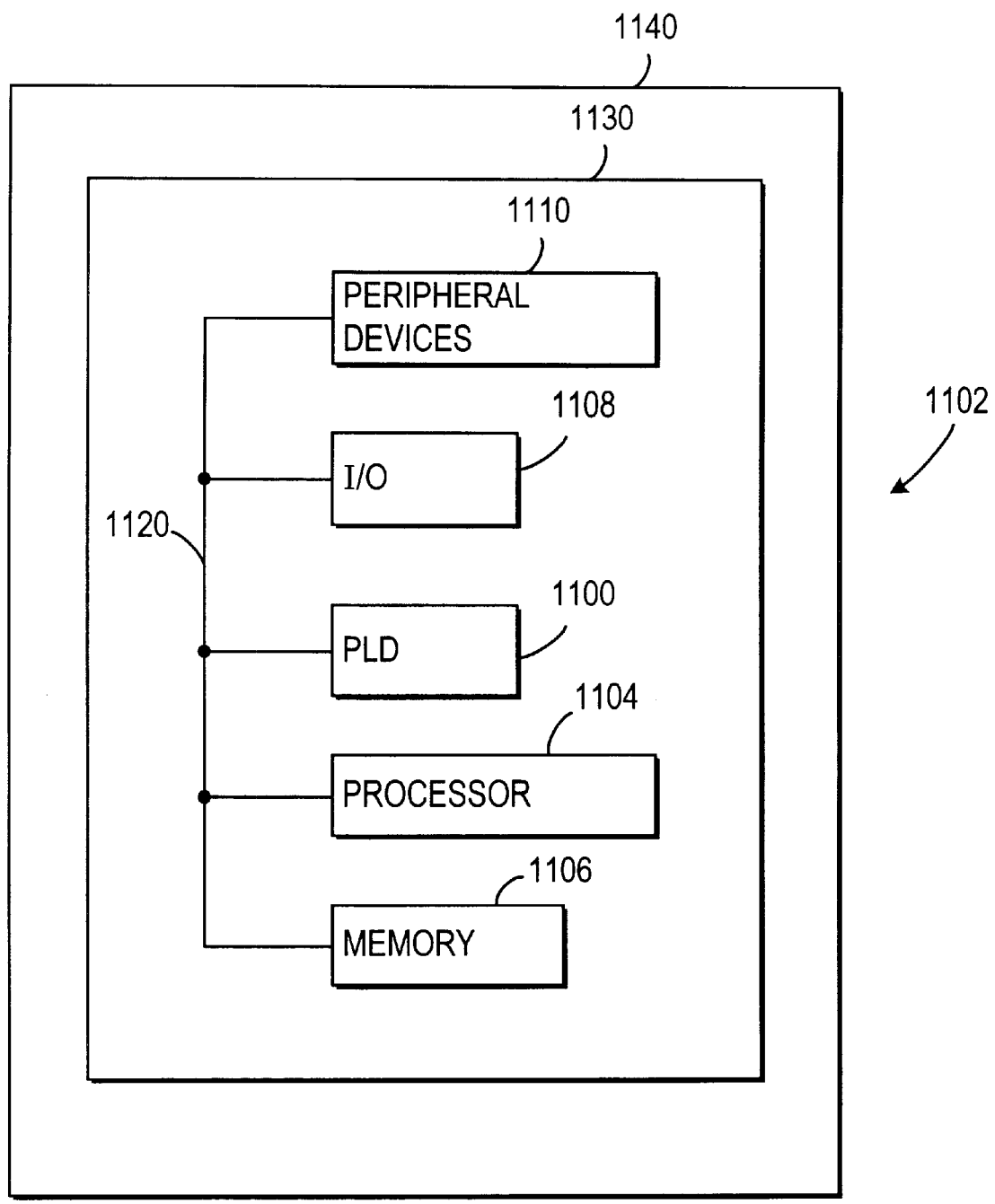
FIG. 11 is a simplified block diagram of an illustrative system incorporating a programmable logic device employing the logic array block of FIG. 2 and/or FIG. 7 in accordance with the principles of the present invention.

FIG. 11 illustrates how a programmable logic device 1100 employing improved LAB 200 and/or 700 may be used in a data processing system 1102. Data processing system 1102 may include one or more of the following components: a processor 1104; memory 1106; I/O circuitry 1108; and peripheral devices 1110. These components are coupled together by a system bus 1120 and are populated on a circuit board 1130 which may be contained in an end-user system 1140.

System 1102 can be used in a wide variety of applications, such as computer networking, data networking, instrumentation, video processing, digital signal processing, or any other application where the advantage of using programmable or reprogrammable logic is desirable. Programmable logic device 1100 can be used to perform a variety of different logic functions. For example, programmable logic device 1100 can be configured as a processor or controller that works in cooperation with processor 1104. Programmable logic device 1100 may also be used as an arbiter for arbitrating access to a shared resource in system 1102. In yet another example, programmable logic device 1100 can be configured as an interface between processor 1104 and one of the other components in system 1102. It should be noted that system 1102 is merely exemplary, and that the true scope and spirit of the invention should be indicated by the following claims.

Various technologies can be used to implement the present invention, as well as the various components which may be used therein (e.g., the above-described PLCs and the FCEs which control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter arrangement, for example, each PLC can be product term logic, implementing functions such as AND, NAND, OR, or NOR. Examples of components suitable for implementing PLCs include EPROMs, EEPROMs, pass transistors, transmission gates, antifuses, laser fuses, metal optional links, etc. As has been mentioned, the components of PLCs can be controlled by various, programmable, function control elements ("FCEs"). (With certain PLC implementations (e.g., fuses and metal optional links) separate FCE devices may not be required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is merely illustrative of the principles of the invention, and that various modifications can be made by those skilled in the art without departing from the scope and spirit of the invention. For example, the number of logic units at each of the various levels in the hierarchy of logic units can differ from the specific examples mentioned herein. Similarly, the numbers of the various types of interconnection conductors and other elements can deviate from the specific examples mentioned herein. Different types and sizes of logic and memory units can be used if desired. It will also be understood that terms like "row" and "column", "horizontal" and "vertical", "odd" and "even", "left" and "right", "top" and "bottom", and other directional or orientational terms are used herein only for convenience, and that no fixed or absolute orientations are intended by the use of these terms. For example, the words in each of the word pairs mentioned above can be reversed if desired.

The invention claimed is:

1. A logic array block, comprising:
    a plurality of logic modules, each logic module having a plurality of input leads, a logic memory element, and a memory access circuit, and wherein in a first mode of operating the logic array block, the associated memory access circuit of each logic module is configured to access information stored in the associated logic memory element; and
    a plurality of auxiliary memory elements, each being associated with a respective one of the logic modules, and wherein in a second mode of operating the logic array block, the associated memory access circuit of each logic module is configured to access information stored in the associated auxiliary memory element, and each auxiliary memory element and its associated logic module are configured to implement a configurable memory structure.

2. The logic array block defined in claim 1, wherein in the second mode, at least one of the plurality of input leads of each logic module is a data input lead on which data for the associated configurable memory structure is applied, and a subplurality of the input leads of each logic module are read address input leads for the configurable memory structure implemented by that logic module and its associated auxiliary memory element.

3. The logic array block defined in claim 1, wherein the configurable memory structure implemented with a respective one of the auxiliary memory elements and its associated logic module is a shift-register.

4. The logic array block defined in claim 3, wherein each auxiliary memory element includes a plurality of auxiliary memory cells, and wherein the shift-register has a plurality of master/slave latch pairings, wherein each master/slave latch pairing includes a master latch and a slave latch, and wherein each master/slave latch pairing is implemented by a pair of auxiliary memory cells in the auxiliary memory element.

5. The logic array block defined in claim 4, wherein information stored within a respective one of the master/slave latch pairings is accessed by using the memory access circuit of the associated logic module to access a bit value stored in the slave latch of that master/slave latch pairing.

6. The logic array block defined in claim 1, wherein the configurable memory structure implemented with a respective one of the auxiliary memory elements and its associated logic module is a random access memory having a plurality of random access memory cells.

7. The logic array block defined in claim 6, wherein each auxiliary memory element includes a plurality of auxiliary memory cells, and wherein each random access memory cell is implemented by a respective one of the auxiliary memory cells in the auxiliary memory element.

8. The logic array block defined in claim 7, wherein information stored within the random access memory cells is accessed by using the memory access circuit of the associated logic module.

9. The logic array block defined in claim 8, wherein each random access memory cell has addressable write circuitry for writing a bit value to be stored in that random access memory cell.

10. The logic array block defined in claim 9, further comprising a write address decoder circuit having a plurality of write address leads and a plurality of write control signal leads, wherein the write address decoder circuit is configured to decode a set of write address signals applied on the write address leads into a plurality of write control signals that are conveyed on the plurality of write control signal leads to control the associated addressable write circuitry of each random access memory cell within the associated random access memories implemented by the plurality of auxiliary memory elements and their associated logic modules.

11. The logic array block defined in claim 10, wherein the plurality of write control signals generated by the write address decoder circuit include a first subplurality of write control signals and a second subplurality of write control signals, and wherein the plurality of write control signal leads include a first subplurality of write control signal leads and a second subplurality of write control signal leads, and wherein the first subplurality of write control signals are conveyed on the first subplurality of write control signal leads to the random access memory cells associated with a first subplurality of logic modules, and the second subplurality of write control signals are conveyed on the second subplurality of write control signal leads to the random access memory cells associated with a second subplurality of logic modules.

12. The logic array block defined in claim 1, wherein the configurable memory structure implemented with a respective one of the auxiliary memory elements and its associated logic module is configurable for operation as a shift-register in a first configuration and as a random access memory in a second configuration.

13. The logic array block defined in claim 1, further comprising direct-connect circuitry configured to combine the respective configurable memory structures implemented by a pair of adjacent auxiliary memory elements and their associated logic modules.

14. A programmable logic device including the logic array block defined in claim 3.

15. A digital processing system comprising:
    processing circuitry;
    a memory coupled to the processing circuitry; and
    a programmable logic device as defined in claim 14 coupled to the processing circuitry and the memory.

16. A printed circuit board on which is mounted a programmable logic device as defined in claim 14.

17. The printed circuit board defined in claim 16 further comprising:
    a memory mounted on the printed circuit board and coupled to the programmable logic device.

18. The printed circuit board defined in claim 17 further comprising:
    processing circuitry mounted on the printed circuit board and coupled to the programmable logic device.

19. A logic module, comprising:

a plurality of input leads, a memory element including a plurality of memory cells, and a memory access circuit, wherein in a first mode of operation, the logic module is configurable to perform any of a plurality of logic functions based on a plurality of logic signals applied on the input leads, and wherein in a second mode of operation, the logic module is configured to implement a shift-register having a plurality of master/slave latch pairings, wherein each master/slave latch pairing includes a master latch and a slave latch, and wherein each master/slave latch pairing is implemented by a pair of memory cells in the memory element.

20. The logic module defined in claim 19, wherein in the second mode of operation, at least one of the plurality of input leads is a data input lead on which data for the shift-register is applied, and a subplurality of the input leads are read address input leads on which a set of read signals are applied, wherein the shift-register is read using the memory access circuit.

21. The logic module defined in claim 20, wherein information stored within a respective one of the master/slave latch pairings is accessed by using the memory access circuit to access a bit value stored in the slave latch of that master/slave latch pairing.

22. The logic module defined in claim 20, further comprising global clearing circuitry, the global clearing circuitry being programmably configurable to clear the contents of the shift-register.

23. A programmable logic device comprising at least one logic array block having a plurality of logic subunits, wherein at least one logic subunit is similar to the logic module defined in claim 19.

24. A digital processing system comprising:

processing circuitry;

a memory coupled to the processing circuitry; and a programmable logic device as defined in claim 23 coupled to the processing circuitry and the memory.

25. A printed circuit board on which is mounted a programmable logic device as defined in claim 23.

26. The printed circuit board defined in claim 25 further comprising:

a memory mounted on the printed circuit board and coupled to the programmable logic device.

27. The printed circuit board defined in claim 26 further comprising:

processing circuitry mounted on the printed circuit board and coupled to the programmable logic device.

28. A method of operating a logic array block including a plurality of logic modules, each logic module containing a logic memory element and a memory access circuit, and wherein the logic array block further includes a plurality of auxiliary memory elements, each auxiliary memory element being associated with a respective one of the logic modules, the method comprising:

performing a plurality of logic functions in a first mode of operating the logic array block, wherein in the first mode, the associated memory access circuit of each logic module is configured to access information stored in the associated logic memory element; and operating the logic array block as one of a plurality of memory structures in a second mode of operating the logic array block, wherein in the second mode, the associated memory access circuit of each logic module is configured to access information stored in the associated auxiliary memory element, and each auxiliary memory element and its associated logic module are configured to implement an associated memory structure that is configurable for operation as a shift-register in a first configuration and as a random access memory in a second configuration.

29. The method defined in claim 28, further comprising:

configuring the memory structure implemented within the logic array block for operation in alternative synchronous and asynchronous modes of operation.

30. The method defined in claim 29, wherein the memory structure has an associated depth and an associated width that are programmably selectively configurable.

* * * * *